United States Patent [19]

Kudla et al.

[11] Patent Number: 5,896,037

[45] Date of Patent: Apr. 20, 1999

[54] INTERFACE TEST ADAPTER FOR ACTIVELY TESTING AN INTEGRATED CIRCUIT CHIP PACKAGE

[75] Inventors: James M. Kudla, Mount Prospect; Luke Chang, Chicago, both of Ill.

[73] Assignee: Methode Electronics, Inc., Chicago, Ill.

[21] Appl. No.: 08/728,886

[22] Filed: Oct. 10, 1996

[51] Int. Cl.⁶ .................................................. G01R 31/02
[52] U.S. Cl. ........................... 324/755; 324/763; 324/765
[58] Field of Search .................................. 324/754, 755, 324/763, 765; 439/65–85

[56] References Cited

U.S. PATENT DOCUMENTS

| | | | |
|---|---|---|---|
| 2,578,288 | 12/1951 | Cook | 200/51 R |
| 4,716,500 | 12/1987 | Payne | 361/750 |
| 5,477,160 | 12/1995 | Love | 324/755 |
| 5,548,223 | 8/1996 | Cole et al. | 324/754 |

*Primary Examiner*—Josie Ballato
*Assistant Examiner*—Russell M. Kobert
*Attorney, Agent, or Firm*—Breffni X. Bagget

[57] ABSTRACT

A Test Adapter for actively testing chip package such as a ball grid array in operation with a printed circuit board are disclosed. The test adapter provides accessible test points for monitoring input and output signals of an operating chip package. The adapter includes an interface adapter board having a plurality of contact pads disposed on its surface, in a pattern corresponding to the footprint of the chip package. A plurality of contact terminals protrude from the bottom of the interface adapter board and are connected to the contact pads on the upper surface, and are configured to engage a receiving socket mounted to a printed circuit board. A plurality of test pins are also connected to the contact pins such that test probes can be connected to the test pins and the input/output signals associated with the chip package can be monitored by the probes.

8 Claims, 4 Drawing Sheets

INTERFACE TEST ADAPTER FOR ACTIVELY TESTING AN INTEGRATED CIRCUIT CHIP PACKAGE

BACKGROUND OF THE INVENTION

The present invention relates to a Test Adapter for actively testing an integrated circuit chip package in combination with a printed circuit board and a method for actively testing an integrated circuit chip package.

Integrated circuit (IC) chips are packaged in an insulating housing. The IC chip, the housing and a signal interface for coupling the IC chip to external components together comprise an IC chip package. The signal interface is critical to the operation of the IC chip package in that it allows the IC chip to interact with external circuit components so that the IC chip can perform meaningful functions. The signal interface must be capable of accommodating all of the electrical signals necessary to operate and communicate with the IC chip. With the continued miniaturization of IC chips, more and more circuit functions can be incorporated into a single chip. Correspondingly, with more and more circuit functions being performed, more and more I/O signals are necessary to operate the IC chips. Not only must larger numbers of signals be connected to the IC chip, but more and more signals must be connected in a smaller and smaller area. In general, IC chip packages are mounted on printed circuit boards which are crowded with other circuit elements, including other chip packages. In most cases, space on the printed circuit boards is limited, and it is beneficial that the signal interface take up as little space as possible. A ball grid array is such an interface.

Ball Grid Array (BGA) chip packages are surface mount devices which connect directly to the surface of a printed circuit board. A grid-like array of hemispherical solder balls is formed on the bottom of the chip package, and internal contact leads connect each solder ball to a different input or output point on the IC chip. On the surface of a printed circuit board, an array of conductive solder pads is formed corresponding to the array of solder balls formed on the chip package. The BGA chip package is placed on the printed circuit board over the solder pads, and placed in a re-flow oven where the solder balls are melted, bonding the BGA chip package to the printed circuit board. Conductive traces connected to the solder pads on the printed circuit board convey electronic signals to and from external circuit components mounted elsewhere on the printed circuit board.

An advantage of BGA chip packages is that the I/O interface is located directly below the chip package so that the interface does not occupy any additional space on the printed circuit board beyond the perimeter of the BGA chip package itself. This contrasts with other IC chip packages where the I/O signals exit through the edges of the chip package, or through pins protruding from the chip package. In these alternate IC chip packages, the interface is external to the outer periphery of the IC package, requiring additional space on the printed circuit board.

One disadvantage of BGA chip packages, however, is that they are difficult to test once they are bonded to the printed circuit board. Because the I/O interface is located directly beneath the chip package, it is not possible to connect test probes to the various signals leads once the chip package is bonded to the printed circuit board. Thus, it is difficult to actively test BGA chip packages in combination with the printed circuit boards they are designed to work with. This drawback is especially significant in the early design/testing stages of developing new products. In these early stages, flaws in the IC chip or the printed circuit board design can cause unexpected product malfunctions, and without the ability to access I/O signals for the purpose of attaching test probes, it is difficult to determine the cause of such malfunctions.

In many applications, active testing of printed circuit boards and IC chip packages is accomplished by applying various combinations of input signals to the printed circuit board and measuring the corresponding output signals to see if they behave as expected. Often, the only way to monitor such signals is to connect test probes at points on the printed circuit board where the signals are accessible. With most integrated circuit chip packages, the point where the I/O signals are most accessible is at the interface between the IC package and the printed circuit board. However, with BGA chip packages, because this interface is located directly beneath the BGA chip package, these points are not accessible for the purpose of landing test probes thereon. Thus, it is not possible to use traditional methods to actively test the operation of BGA chip packages in combination with the printed circuit boards to which they are mounted. One solution to this problem is to design test points into the printed circuit board. Using this method, conductive test points such as pins, or conductive pads are formed on the printed circuit board in locations where they are easily accessible, and conductive traces are formed on the printed circuit board connecting the test points to the various I/O signals, thereby providing a means to monitor the operation of the chip package and the printed circuit board. A major drawback of this method, however, is that it tends to defeat the purpose for using a BGA chip package in the first place, namely, saving space on the printed circuit board. Adding the test points and connections from the test points to the I/O signals can easily consume more board space than one of the alternate methods of mounting an IC package.

From the foregoing discussion, it is clear that a need exists for providing a mechanism for actively testing BGA chip packages in combination with the printed circuit board on which it is to be mounted. Such a mechanism must necessarily provide for the complete interconnection of the BGA chip package to the printed circuit board so that the combination operates the same as under normal conditions. The test mechanism must also provide accessible test points for at least a limited number of I/O signals from the BGA chip package so that the BGA chip package and printed circuit board can be monitored by measuring the active I/O signals. It is desirable that such a test mechanism would have test points in the form of contact pins to which probes are easily attached. It is also desirable to have test pins arranged into groups, or headers for easy connection to external test equipment. Such groupings could include ribbon cable headers, or pin grids, which are well known in the art and can be readily connected to other devices using existing connector hardware. Finally, it would be advantageous to provide a test mechanism where the test points are programmable such that any given test point can be programmed to connect to any given I/O point on the BGA chip package. This type of programmability would make such a test mechanism more versatile in that it could be used over and over with different BGA chip packages, and different printed circuit boards which require different I/O points to be monitored.

SUMMARY OF THE INVENTION

In accordance with the background given above, one of the main objectives of the present invention is to provide a test adapter for actively testing an integrated circuit chip package operating in combination with a printed circuit board.

A further objective of the present invention is to provide a test adapter for actively testing a Ball Grid Array (BGA) chip package.

Another object of the present invention is to provide a method of actively testing a BGA chip package operating in conjunction with a printed circuit board.

A further object of the present invention is to provide a test adapter which provides accessible test points so that I/O signals associated with the integrated circuit can be actively monitored, while maintaining complete interconnectability between the integrated circuit chip package and a printed circuit board without consuming additional space on the surface of the printed circuit board.

Another objective of the present invention is to provide a test adapter for actively testing an integrated circuit chip package wherein the test points are in the form of test pins to which probes are easily attached.

Still another objective of the present invention is to provide a test adapter for actively testing an integrated circuit chip package wherein test pins for monitoring the I/O signals of the integrated circuit chip are formed on a separate header board, and where the test pins are arranged to facilitate connection to test equipment.

An additional objective of the present invention is to provide an adapter for actively testing an integrated circuit chip package wherein test pins for monitoring the I/O signals associated with the integrated circuit chip are grouped together in at least one grid array header.

A further objective of the present invention is to provide a test adapter for actively testing an integrated circuit chip package wherein the interconnections between a plurality of test contact points and I/O signals emanating from the integrated circuit chip are programmable such that any given test point can be programmed to connect to any given I/O signal from the integrated circuit chip package.

A still further objective of the present invention is to provide a test adapter for actively testing an integrated circuit chip package having programmable interconnections between monitored signals and test pins wherein the programmable connections are formed in Field Programmable Inter-Connection Devices.

Another additional objective of the present invention is to provide a test adapter for actively testing an integrated circuit chip package having programmable interconnections between monitored signals and test pins wherein programmed instructions for configuring a Field Programmable Inter-Connection Device are stored on an EPROM chip as part of the test adapter.

All of these objectives, as well as others that will become apparent upon reading the detailed description of the presently preferred embodiments of the invention, are met by the Ball Grid Array Test Adapter disclosed herein.

In the presently preferred embodiments a Test Adapter is provided which allows an integrated circuit chip package, most importantly a Ball Grid Array (BGA) chip package, to be electrically coupled to a printed circuit board such that the chip package and printed circuit board can be operated as though the chip package were mounted directly to the printed circuit board. Accessible test points on the adapter are electrically connected to each contact of the BGA chip package so that the input and output signals of the BGA chip package can be monitored. In a preferred embodiment, the interconnections between BGA chip package I/O signals and test points are programmable such that any I/O signal can be selectively connected to any test point.

A first embodiment comprises a single interface adapter board. An array of solder pads are formed on a top surface of the interface adapter board in a pattern corresponding to the array of solder balls on the underside of a BGA chip package. Contact pins extend from the bottom surface of the interface adapter board directly below each solder pad on the upper surface. Each solder pad on the top surface is electrically connected to the corresponding contact pin on the bottom surface. The contact pins extending from the bottom surface are configured to mount to a PGA socket mounted on a printed circuit board, the PGA socket being mounted to the printed circuit board in place of a BGA chip package. Additional contacts, in the form of test pins, extend from the upper surface of the interface adapter board and are distributed around the board's periphery. Conductive traces formed on various layers of the interface adapter board electrically connect each test pin to a separate solder pad. A BGA chip package is mounted on the interface adapter either directly, or by bonding the BGA chip package to a pin header and inserting the pin header into a PGA socket bonded to the interface adapter board. Contact pins on the bottom of the interface adapter board are then inserted into the PGA socket mounted on the printed circuit board, thereby coupling the BGA chip package to the printed circuit board. Because the contact pins are directly connected to the I/O points on the BGA chip package, the printed circuit board can be operated as though the BGA chip package were mounted directly to the printed circuit board. Since the test pins on the outer periphery of the interface adapter board are electrically connected to the BGA I/O points, test probes can be connected to the test pins to actively monitor the I/O signals passing between the BGA chip package and the printed circuit board.

In a second embodiment, an interface adapter board similar to that of the first embodiment is provided. As with the first embodiment, a chip package is mounted to an interface adapter board and the interface adapter board is coupled to a printed circuit board so that the printed circuit board can be operated as though the chip package were mounted directly on the printed circuit board. However, rather than having test pins disposed around the perimeter of the interface adapter board, a separate test header board is provided. Test pins are grouped together on the header board where they can be accessed by test probes or other test equipment. A flexible cable or flexible printed circuitry extends between the interface adapter board and the test header board, and provides a means for electrically connecting the test pins on the header board to the I/O signals passing through the interface adapter board. As with the first embodiment, a direct one to one electrical connection is made between each test pin on the header board and each solder pad on the interface adapter board so that each of the I/O signals passing between the chip package and the printed circuit board can be monitored from the header board. The test pins on the header board can be grouped in various configurations for easy connection to other test equipment. For example, test pins can be grouped into a plurality of ribbon headers for connection to ribbon cables, or the test pins can be grouped into a number of grid arrays of particular spacing for connection to socket connectors provided by other test equipment.

A third embodiment is a further refinement of the second embodiment. Like the second embodiment, an interface adapter board is provided for coupling an integrated circuit chip package to a printed circuit board. Test pins are disposed on a separate test header board with a flexible cable or flexible printed circuitry providing the electrical connection between the interface adapter board and the header board. However, in the third embodiment, there is no direct electrical connection between the I/O signals passing through the interface adapter board and the test pins on the test header board. Instead, connections between the I/O signals and the test pins are programmable. The cable between the interface adapter board and the header board provides electrical connection between each of the solder pads and the header board, but at the header board, rather than connecting directly to test pins, the individual conductors of the cable are connected as inputs to a number of Field Programmable Inter-Connection Devices (FPID). The outputs from these FPID are then connected to the test pins located elsewhere on the header board. Configuration data in the form of programmed instructions stored on a PROM memory chip mounted to the test header board are used to configure the field programmable interconnection device. The configuration data dictate which FPID inputs are connected to which FPID outputs. In other words, when a chip package is mounted to the test adapter, the configuration data for the programmable inter-connect device determines which I/O signal is connected to which test pin. Since the configuration data is programmable, the interconnections between the chip package and the test pins can be changed by changing the configuration data. Depending on the configuration data, any given test contact can be connected to any given I/O signal. Thus, a more flexible test adapter is provided which is adaptable for use with various integrated circuit chip packages and printed circuit boards having different test requirements and utilizing different test equipment.

DETAILED DESCRIPTION OF THE PRESENTLY PREFERRED EMBODIMENTS

The present invention is for a test adapter for actively testing integrated circuit (IC) chip packages, and a method of actively testing an IC chip package as it interacts with a printed circuit board.

Figure 1:
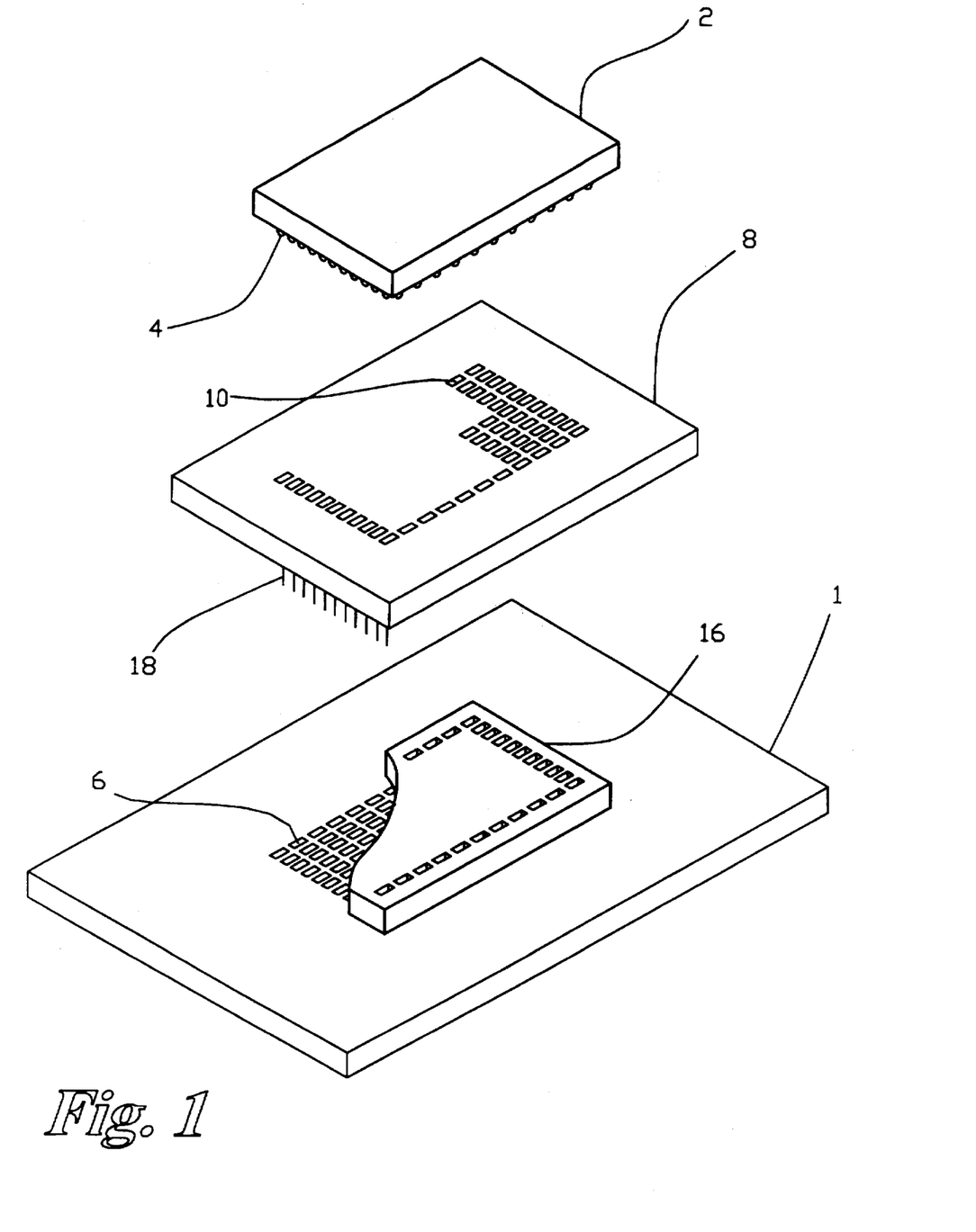
FIG. 1 is an exploded view of a first embodiment employing a simplified mounted arrangement.
Figure 2:
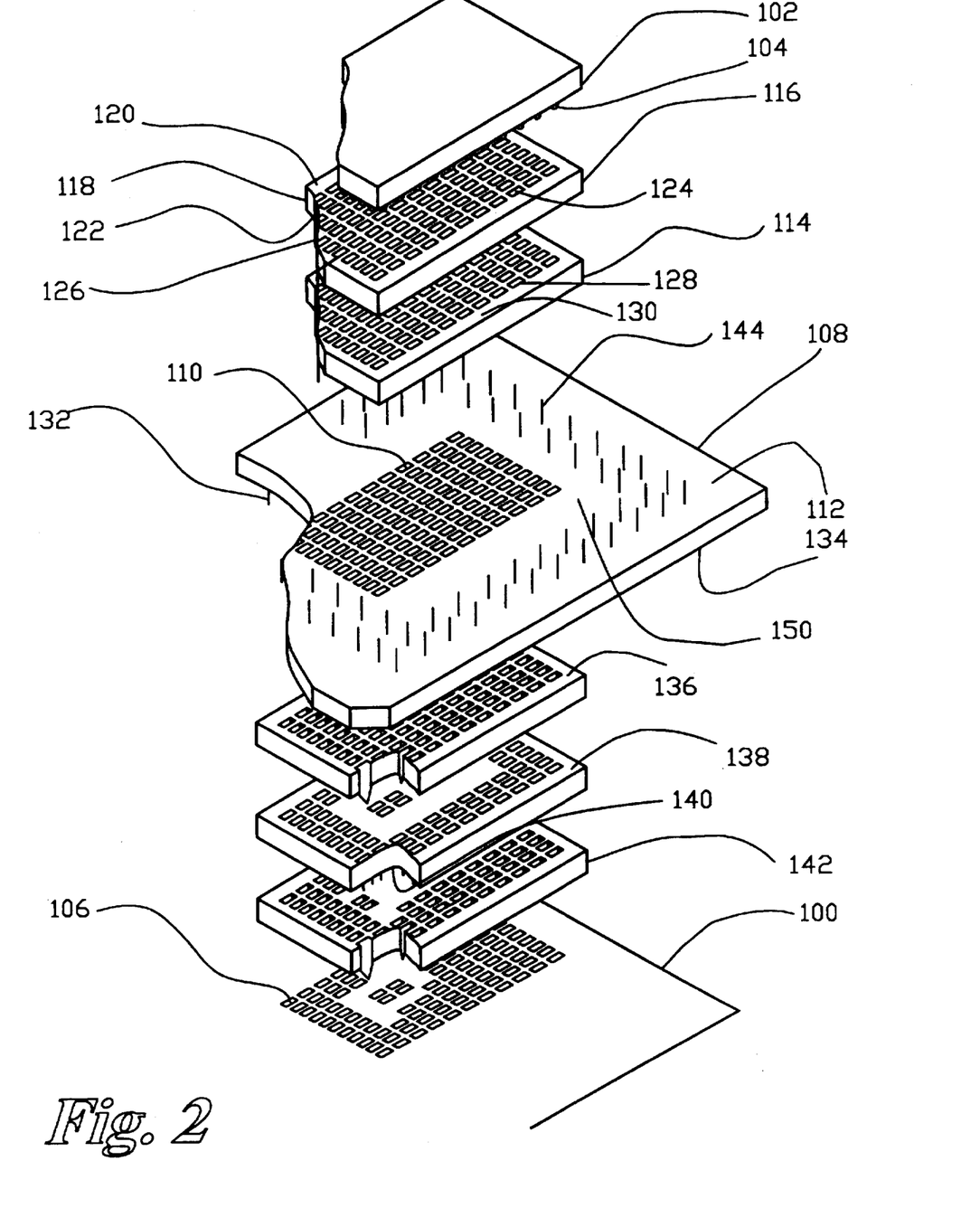
FIG. 2 is an exploded view of the same first embodiment shown in FIG. 1, but employing a more complex mounting arrangement.

The embodiments described herein specifically relate to an adapter for actively testing Ball Grid Array (BGA) chip packages, however, it should be understood that alternate configurations of the present invention are possible which would allow active testing of IC chip packages other than ball grid arrays, and have contact configurations and spacing other than that specifically described herein. Also, a number of components are described for mounting a BGA chip package to a test adapter, and for mounting a test adapter to a printed circuit board. These components are disclosed in the preferred embodiments because of the high degree of flexibility they offer for testing various chip packages having varied contact arrangements. The mounting components described offer the additional advantage of allowing the chip package, the test adapter, and the printed circuit board, to be re-used after testing is completed. While these mounting components enhance the functionality of the present test adapter, they should not be considered as limitations to the present invention. Many alternate mounting means are well known in the art, any of which could be substituted for the mounting means herein disclosed, without deviating from the novel aspects of the invention. For example, FIG. 1 shows a first embodiment of the invention having a relatively simple mounting configuration, and FIG. 2 shows the same embodiment employing a more sophisticated mounting configuration. After a brief description of the simplified mounting configuration of FIG. 1, the first embodiment of the invention will be described in full with reference to FIG. 2.

In FIG. 1 a printed circuit board 1 is shown configured to receive a BGA chip package 2. A pin grid array (PGA) socket 16 having contacts spaced on 0.050" centers is bonded to solder pads 6 on the printed circuit board 1. An interface adapter board 8 is interposed between the printed circuit board 1, and the BGA chip package 2, and solder balls 4 are bonded to solder pads 10 on the interface adapter board rather than being bonded directly to the solder pads 6 on printed circuit board 1. Contact pins 18 extend from the bottom of the interface adapter board, and are insertable into the PGA socket 16. With the BGA chip package mounted to the interface adapter board 8, and the interface adapter board inserted into the PGA socket 16, the BGA chip package is directly coupled to the printed circuit board 1.

The simplified method of mounting a BGA chip package to an interface adapter board, and mounting an interface adapter board shown in FIG. 1 accomplishes the primary function of coupling the BGA chip package to the printed circuit board with an interface adapter board interposed therebetween. This mounting method is equally applicable to all of the embodiments disclosed herein. However, the mounting method of FIG. 1 is subject to a number of shortcomings. Most notably, soldering a BGA directly to the interface adapter board can damage both the BGA chip package and the interface adapter board. Also, once a BGA chip package has been soldered to the interface adapter board, the interface adapter board cannot be reused with another BGA chip package. This significantly limits the utility of the invention. Therefore, it is more desirable to use a more sophisticated method for coupling a BGA chip package to a printed circuit board through an interface adapter board.

Referring now to FIG. 2, the first embodiment of the invention is shown employing a more complex and flexible mounting scheme. A printed circuit board 100 configured to receive a Ball Grid Array (BGA) chip package 102 is provided. The BGA chip package 102 is formed with a plurality of solder balls 104 protruding from the bottom of the chip package. The solder balls 104 are arranged in a grid-like array, and constitute the signal interface between the IC chip housed within the chip package 102 and external electronic components to be coupled thereto. A plurality of solder pads 106 are formed in a grid-like array on the printed circuit board 100, corresponding to the array of solder balls 104 on the underside of the chip package 102. The solder balls 104 and the solder pads 106 are arranged in a one to one relationship so that each solder ball 104 can be bonded directly to an individual solder pad 106 on the printed circuit board 100. When directly coupled in this fashion, the chip package 102 and the printed circuit board 100 function together as a unit, with I/O signals passing unimpeded between the two components. However, as discussed, with a BGA chip package 102 mounted directly to the printed circuit board 100, the I/O signals passing between the solder balls 104 and the solder pads 106 are inaccessible for purposes of actively testing the printed circuit board in combination with the BGA chip package. Accordingly, an interface adapter board 108 is provided for coupling the chip package 110 to the printed circuit board 100.

The interface adapter board 108 acts as an intermediate mounting structure for attaching a chip package 102 to the printed circuit board 100. A grid-like array of solder pads 110 is formed on an upper surface 112 of the interface adapter board 108. In the preferred embodiment the solder pads 110 on the interface adapter board 108 form a 26×26 array to accommodate BGA chip packages having up to 676 I/O points. It is possible that the BGA chip package 102 can be mounted directly to the interface adapter board 108 by soldering the solder balls 104 directly to the solder pads 110. However, this mounting technique is not preferred because the interface adapter board 108 can be damaged during the soldering process, and the soldering prevents the BGA chip package 102 and the interface adapter board 108 from being reused after testing has been completed. In the preferred embodiment a first PGA mounting socket 114 or some other style chip mounting socket is mounted to the interface adapter board 108. The BGA chip package 102 is then mounted to a BGA pin header 116 which can be inserted into the first PGA socket 114. A BGA pin header 116 comprises a rigid board 118 having an upper surface 120 and a lower surface 122. A 26×26 array of solder pads 124 are formed on the upper surface 120 to receive a BGA chip package 102 having up to 676 contact points. A 26×26 array of contact pins 126 protrude from the lower surface 122 of the pin header 116. The solder pads 124 on the upper surface 120, and the pins 126 on the lower surface 122 are electrically connected through the pin header 116. Thus, the pin header 116 converts the I/O points of a BGA chip package 102 from an array of solder balls 104 to an array of contact pins 126. The first PGA chip socket 114 is formed with a 26×26 array of contact cavities 128 formed in the upper surface of the socket 130. Each contact cavity 128 houses an individual contact element (not shown) configured to receive a contact pin 126 from a the pin header 116, and a contact tail (not shown) which can be soldered to the solder pads 110 formed on the upper surface 112 of the interface adapter board 108. When assembled in this fashion a BGA chip package 102 mounted to a pin header 116 can be readily inserted and removed from the first PGA socket 114 without additional soldering performed on the interface adapter board 108. This mounting arrangement provides direct electrical coupling between all of the I/O contacts of a 26×26 BGA chip package 102 and the 676 solder pads 110 formed on the upper surface 112 of the interface adapter board 108.

The interface adapter board 108 is configured to mount to the printed circuit board 100 in place of a BGA chip package 102. A 26×26 array of contact pins 132 extends from the lower surface 134 of the interface adapter board 108. Each contact pin 132 is connected through the interface adapter board 108 to one of the solder pads 110 formed on the upper surface 112 of the board. The contact pin grid is configured to be insertable into a second PGA socket 136 similar to the first PGA socket 114 mounted on the upper surface 112 of the interface adapter board 108. The second PGA socket 136 can be mounted either directly to the printed circuit board 100, or to a custom pin header 138. Mounting the second PGA socket 136 to a custom pin header 138 has the advantage of simplifying the connections with the printed circuit board 100. As noted, the interface adapter board 108 is configured to couple a 26×26 array of I/O signals from a BGA chip package 102 to a printed circuit board 100. The size of this array is completely arbitrary, and has been chosen to accommodate the largest variety of BGA chip packages possible. Most chip packages being tested with the present test adapter will utilize less than the fall 676 signal capacity of the adapter. In other words, not all of the 676 contact pins 132 extending from the bottom surface 134 of the interface adapter board 108 are necessary to test a given BGA chip package 102. Attaching the second PGA socket 136 to a custom pin header 138 accounts for this fact, and matches the footprint of the interface adapter board 108 to the footprint of the particular BGA chip package 102 being tested. Thus, whereas the generic pin header 116 for mounting a BGA chip package 102 to the interface adapter board 108 includes a full 26×26 grid of output pins 126, the custom pin header 138 provides pins only at those grid locations actually employed by the particular BGA chip package 102 being tested. The custom pin header can then be inserted into a custom PGA socket 142 which is bonded to the printed circuit board 100. Like the custom pin header 138, the custom PGA socket 142 matches the footprint of the BGA chip package 102 being tested, and conveys only those signals that are actually being used. This allows the printed circuit board 100 to be formed with only those solder pads 106 conforming to the footprint of the BGA chip package 102 rather than having a generic 26×26 grid. Mounting the chip package 102 to the interface adapter board 108, and mounting the interface adapter board to the printed circuit board 100 in this manner provides direct electrical interconnection between all of the I/O signals of the chip package 102 to the printed circuit board 100, and the printed circuit board is fully operable as though the chip package where mounted directly to the printed circuit board.

Active testing of the chip package 102 is provided by test pins 144 which extend from the upper surface 112 of the interface adapter board 108. In the preferred embodiment, the test pins 122 are arranged in one of two alternate configurations. In the configuration shown, the test pins extend directly from the interface adapter board, and are formed into arrays along the four sides of the board, with each pin spaced on 0.050" centers. In an alternate configuration, the test pins 144 are grouped into headers (not shown) for easier connection to electrical connectors. When headers are used, the test pins are spaced on 0.050" centers along the length of the header, and 0.100" centers from header to header. Like the contact pins 132, the test pins 144 correspond on a one to one basis with each of the 676 solder pads 110 formed on the upper surface 112 of the interface adapter board 108. Conductive traces 150 connect each solder pad 110 with one test pin 144. Because of the large number of conductive traces 150 required to connect each solder pad 110 to one test pin 144, the interface adapter board 108 is constructed as a multi-layered circuit board so that all signals can be brought to the perimeter of the interface adapter board 108 without interfering with one another.

As noted earlier, with a chip package 102 mounted to the interface adapter board 108, and the interface adapter board mounted to the printed circuit board 100, the printed circuit board can be operated as though the chip package 102 were mounted directly to the printed circuit board 100. I/O signals passing between the chip package 102 and the printed circuit board 100 travel through the interface adapter board 108. The test pins 144, being electrically connected to the solder pads 110, tap these signals and provide an access point where these signals can be monitored. The arrangement of the test pins 144 around the periphery of the interface adapter board 108 allows sufficient space for probes (not shown) or electrical connectors to be attached to individual test pins 144 or groups of test pins so that individual signals can be monitored. By monitoring these test points, the chip package 102 can be actively tested while in operation with the printed circuit board 100.

Figure 3:
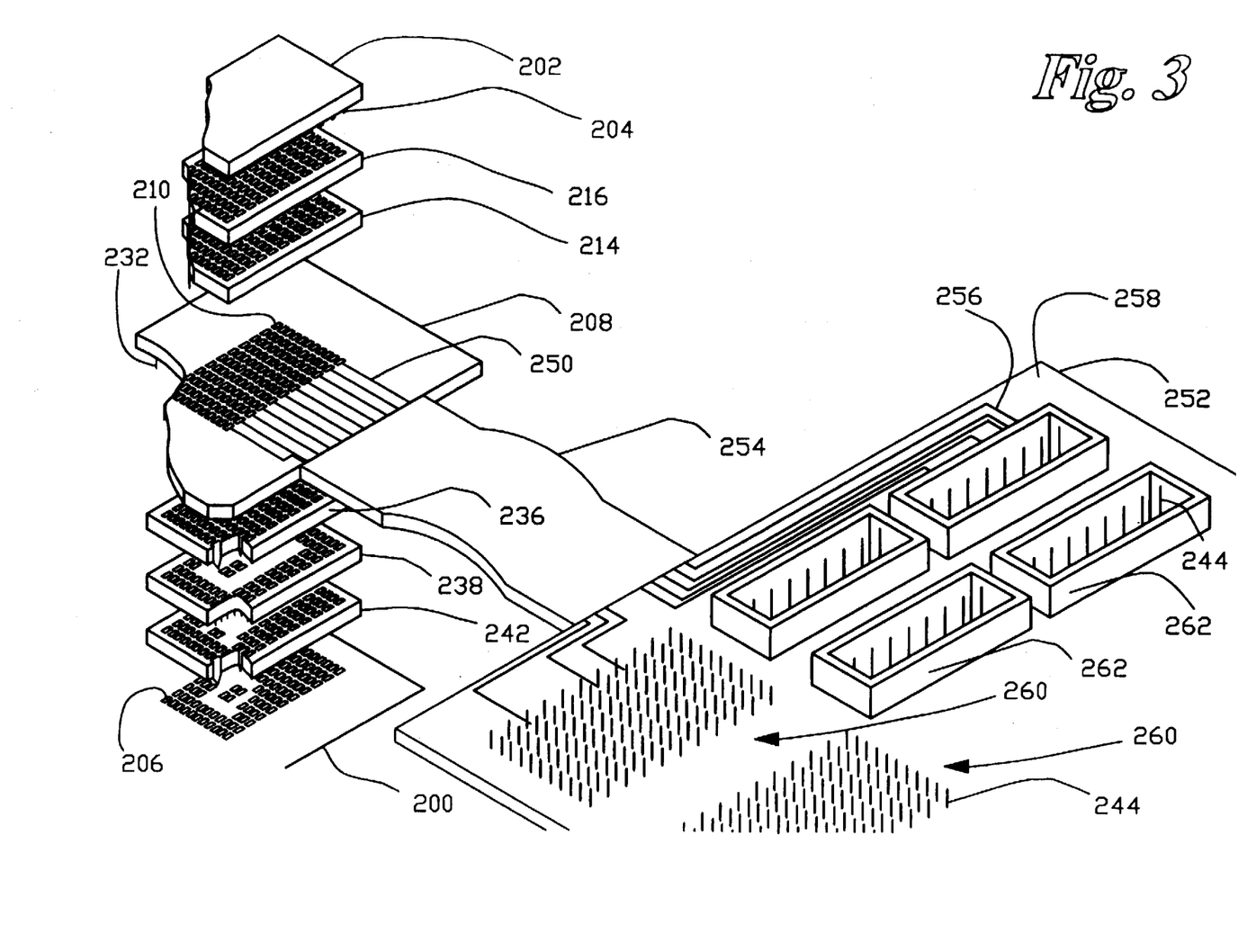
FIG. 3 is an exploded view of a second embodiment of the invention.

Referring now to FIG. 3, a second embodiment of the invention is shown. As with the first embodiment, an interface adapter board 208 is provided for coupling a chip package 202 to a printed circuit board 200. The provisions for attaching a BGA chip package to the interface adapter board 208, and coupling the interface adapter board 208 to the printed circuit board 200 are identical to those of the first embodiment, and need not be explained in depth here. For the purpose of understanding FIG. 3, it is sufficient to note that a BGA chip package 202 is mounted to a BGA pin header 216, and the BGA pin header 216 is inserted into a first PGA socket 214 which is soldered to the interface adapter board 208. Contact pins 232 extending from the bottom of the interface adapter board 208 are inserted into a second PGA socket 236, the second PGA socket being coupled to a custom pin header 238 which corresponds to the footprint of the BGA chip package 202. The custom pin header 238 is insertable into a custom PGA socket 242 which is soldered to contact pads 206 formed on the printed circuit board 200. In this way, I/O signals are electrically coupled between the printed circuit board 200 and the BGA chip package 202.

The primary difference between the first embodiment and the second embodiment is the location of test contacts for monitoring the various I/O signals. Whereas the first embodiment provided a plurality of test contact pins 144 disposed around the outer periphery of the interface adapter board 108 (see FIG. 2), the second embodiment provides a separate test header board 252 for mounting test pins. The interface adapter board 208 and test header board 252 together form a "rigid-flex" assembly having a flat conductor cable or flexible printed circuitry 254 disposed between the two boards. In the preferred embodiment the connection between the interface adapter board 208 and the test header board 252 is made by flexible printed circuitry in the form of multiple layers of unsupported polyimide having a plurality of conductive traces formed between each layer.

The purpose of the interface adapter board is to couple I/O signals between the chip package 202 and the printed circuit board 200 while at the same time providing access points for probes so that these same I/O signals can be monitored while the chip package 202 is active. The interface adapter board 208 provides access to the I/O signals by attaching conductive traces 250 to each of the solder pads 210 to which the chip package terminals 204 are coupled. These conductive traces 250 connect each solder pad 210 to the individual conductors of the flexible cable or flexible printed circuitry 254, and the signals present at the solder pads 210 are conveyed to the test header board 252. To accommodate the large number of conductive traces 250 necessary to connect each solder pad 210 to the individual conductors of the flexible cable or flexible printed circuitry 254, the interface adapter board 208 is constructed as a multi-layer board. Conductive traces 250 are formed on different layers so that signals can pass over one another without interfering with one another. The flexible cable or flexible printed circuitry 254 between the interface adapter board 208 and the test header board 252 is also multi-layered. At an edge of the interface adapter board 208, the various layers of the flexible cable or flexible printed circuitry 254 are laminated between the layers of the interface adapter board 208. Vias (not shown) connect the various conductive traces from different layers of the interface adapter board 208 to the conductive traces on the flexible cable or flexible printed circuitry 254. Thus, the I/O signals associated with each solder pad 210 are connected to the flexible cable or flexible printed circuitry 254 and conveyed from the interface adapter board 208 to the test header board 252.

The test header board 252 is also a multi-layered printed circuit board, and is formed with tests pins 244 extending from an upper surface 258 of the of the board. The test header board 252 is attached to the flexible cable or flexible printed circuitry 254 in the same manner as the interface adapter board 208. Individual layers of the flexible cable or flexible printed circuitry 254 are laminated between the various layers of the test header board 252, and vias (not shown) connect the individual conductors of the flexible cable or flexible printed circuitry 254 to conductive traces 256 formed on the various layers of the test header board 252. The conductive traces 256 on the test header board 252 connect the I/O signals to test pins 244 located at various points on the test header board 252. Monitoring of individual I/O signals is accomplished by connecting test probes to the appropriate test pins 244.

The test pins 244 on the header board 252 can be grouped in various arrangements to facilitate connection to external test equipment. For example, test pins 244 can be grouped into multiple pin arrays 260 or ribbon headers 262 as shown in FIG. 2. Thus, test equipment having ribbon cable connectors or pin sockets for connecting test signals can be easily coupled to the test pins 244 on the test header board 252. The examples given are for the purpose of illustration only and should not be considered as limiting the possible arrangement of test pins 244 on the header board 252 in any way. It is likely that test header boards for different applications would have differing test pin 244 arrangements such as only ribbon headers 262,or only pin arrays 260, some combination of both pin headers 262 and pin arrays 260, or some other arrangement altogether. Providing such alternate test pin arrangements on a separate test header board provides extra flexibility in designing and connecting test equipment to the test adapter, especially in cases where large numbers of signals are to be monitored.

Figure 4:
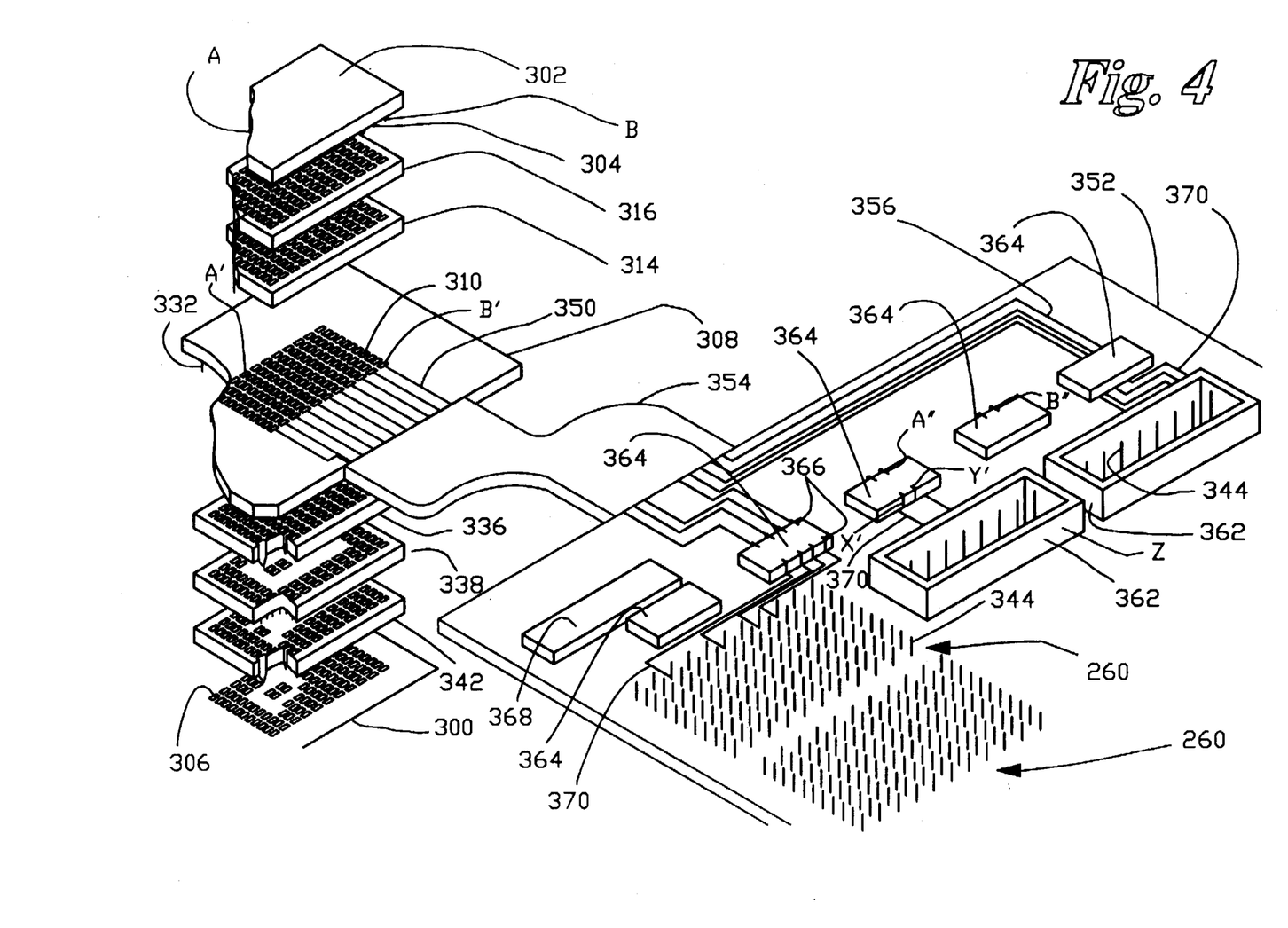
FIG. 4 is an exploded view of a third embodiment of the invention.

A third embodiment of the invention is shown in FIG. 4. As with the first two embodiments, an interface adapter board 308 is provided for coupling a chip package 302 to a printed circuit board 300. The provisions for attaching a BGA chip package to the interface adapter board 308, and coupling the interface adapter board 308 to the printed circuit board 300 are identical to those of the first embodiment, and need not be explained in depth here. For the purpose of understanding FIG. 4, it is sufficient to note that a BGA chip package 302 is mounted to a BGA pin header 316, and the BGA pin header 316 is inserted into a first PGA socket 314 which is soldered to the interface adapter board 308. Contact pins 332 extending from the bottom of the interface adapter board 308 are inserted into,a second PGA socket 336, the second PGA socket being coupled to a custom pin header 338 which corresponds to the footprint of the BGA chip package 302. The custom pin header 338 is insertable into a custom PGA socket 342 which is soldered to contact pads 306 formed on the printed circuit board 300. In this way, I/O signals are electrically coupled between the printed circuit board 300 and the BGA chip package 302.

The third embodiment, like the second, comprises a "Rigid-Flex" assembly including the interface adapter board 308, a separate multi-layer test header board 352, and a flat conductor cable or flexible printed circuitry 354 disposed therebetween. Individual layers of the flat conductor cable or flexible printed circuitry 354 are laminated between the layers of the test header board 352. Vias (not shown) connect the individual conductors of the flat conductor cable or flexible printed circuitry 354 to conductive traces 356 formed on the test header board 352. The differences between the second and third embodiments lie in the configuration of the header board 352. In the second embodiment, although the test pins are removed to a separate header board, there still exists a one to one correspondence between each test pin 244 and each solder pad 210 on the interface adapter board (see FIG. 3). Each solder pad is electrically connected to exactly one test pin and vice versa. With the third embodiment such one to one correspondence does not exist. With the third embodiment, the flexible cable or flexible printed circuitry 354 connects I/O signals from the chip package 302 to the header board 352, but from there, the conductive traces 356 on the header board 352 connect the I/O signals not to individual test pins, but rather to the inputs of field programmable inter-connect devices (FPID) 364.

An FPID 364 is a solid state electronic device having a plurality of I/O points 366. The I/O points 366 are configurable such that each point can serve as either an input or an output to the FPID, and more importantly, any input point can be programmed to be connected to any output point. In the preferred embodiment the FPID used are model no. IQ160 produced by I-Cube, Inc. of Santa Clara, Calif. Each such FPID provides one hundred-sixty (160) configurable I/O points. Ten such FPIDs 364 are supplied on the header board 352, and the configuration data for programming the FPID are stored in an EPROM chip 368 mounted directly to the header board 352.

As with the previous embodiments, the interface adapter board 308 is formed with a 26×26 array of solder pads 310 for receiving up to 676 I/O signals from a BGA chip package 302. Thus up to 676 signals must be monitored from the header board 352. Access to these signals is provided by test pins 344 protruding from the header board 352. Like the second embodiment, these pins can be grouped in various arrangements to facilitate connection to external test equipment. For example, test pins 344 can be grouped into multiple pin arrays 360 or ribbon headers 362, as shown in FIG. 3. In these examples test equipment having ribbon cable connectors or pin sockets for the test signal interface can be easily coupled to the test pins 344 mounted on the header board 352. These examples are given for the purpose of illustration only and should not be considered as limiting the possible arrangement of test pins 344 on the header board 352 in any way.

Unlike the first two embodiments, the test pins 344 of the third embodiment are not directly connected to the I/O signals emanating from the chip package 302. Rather, conductive traces 370 formed on the header board 352 connect the test pins 344 to outputs of the FPID 364. Since all 676 I/O signals from the interface adapter board are connected to inputs to the FPID, the FPID must provide programmable interconnection between 676 input signals and 676 individual test pins 344. The FPID 364 are arranged and interconnected on the header board 352 so that, through proper configuration of the FPID, any given I/O signal from the BGA chip package 302 can be interconnected to any given test pin 344. For example, suppose that it is desired to monitor two signals from the BGA chip package 302, and that these signals connect to the chip package through solder balls A and B (see FIG. 3). Suppose further, that because of the configuration of the test equipment it is desired to monitor these two signals from test pins X and Y which are located in the first and second positions of a 60 pin ribbon header Z on header board 352. When the chip package 302 is mounted to the interface adapter board 308, solder balls A and B are coupled to individual solder pads A' and B' on the interface adapter board 308, as well as being coupled to the printed circuit board 300. Solder pads A' and B' are connected to individual conductors of the flat conductor cable or flexible printed circuitry 354. At the other end, conductive traces 356 on the test header board 352 connect the individual conductors of the flexible cable or flexible printed circuitry 354 to inputs A", B" of the FPID 364. Thus, a direct electrical connection is made between solder balls A and B, and FPID inputs A" and B". The FPID can then be configured such that inputs A", B" are inter-connected to outputs X', Y'. Outputs X', Y' being the FPID output pins connected via conductive traces 370 to test pins X and Y. Thus, while signals A and B are located at opposite ends of the chip package 302, they can be monitored by connecting a single ribbon connector to header Z and monitoring two adjacent pins, X and Y. The fact that any signal can be connected to any test pin provides great flexibility in testing a wide range of chip packages and using varied test apparatus in performing such tests. Upon completing the testing of a particular product, alternate interconnection configurations are possible for testing different products merely by reprogramming the EPROM chip 368.

With all of the embodiments herein disclosed, it may be necessary to provide signal filtering in order to provide accurate readings of the I/O signals being monitored. The filtering options presently preferred include providing one or more ground planes between various layers of the interface adapter board, the test header board and/or the flat conductor cable or flexible printed circuitry, and passive or active filtering of select I/O signals. Whichever option is selected will generally be an application specific selection, and can be incorporated into the design of an individual test adapter.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

What is claimed is:

1. A test adapter for providing accessible test points for actively monitoring multiple input and output signals of a ball grid array integrated circuit chip package, said adapter comprising:

a BGA pin header for passing input/output signals between said grid array (BGA) integrated circuit chip package and printed circuit board, said BGA pin header having an array of pads for receiving said balls of said ball grid array integrated circuit chip package and an array of pins for communication of said input/output signals with said printed cicuit board, said BGA pin header thereby converting input/output signals communicated on balls on said ball grid array integrated circuit chip package to an array of pins communicating said input/output signals;

a pin grid array socket for receiving said pins from said BGA pin header and providing said input/output signals on an array of contact tails, said tails for bonding to a interface adapter board;

an interface adapter board for mounting said grid array (BGA) integrated circuit chip package to said printed circuit board for communicating said input and output signals to and from said ball grid array integrated circuit chip package;

a plurality of test contacts located at the periphery of said interface adapter board whereby said input and output signals are conveyed between said ball grid array integrated circuit chip package and said printed circuit board, and can be actively monitored from said test contacts;

a plurality of contact pads disposed on a first surface of said interface adapter board, and arranged to send and receive said input and output signals;

a plurality of output contacts disposed on a second surface of said interface adapter board being arranged to mount on a printed circuit board in place of said chip package, each said output contact being electrically connected to one said contact pad;

a plurality of test contacts wherein each test contact is electrically connected to one said contact pad; and whereby said input and output signals are conveyed between said ball grid array integrated circuit chip package and said printed circuit board, and can be actively monitored from said test contacts.

2. The test adapter of claim 1 further comprising custom means for matching a footprint of the interface adapter board to the footprint of said ball grid array (BGA) integrated circuit chip package under test.

3. The adapter of claim 1 wherein said test contacts comprise contact pins protruding from said interface adapter board and having a one to one correspondence with the footprint of the ball grid array (BGA) integrated circuit chip package.

4. The adapter of claim 3 further comprising custom means for matching a footprint of the interface adapter board to the footprint of said ball grid array (BGA) integrated circuit chip package under test, said custom means including a second pin grid array socket, for electrical connection at the second side of said interface adapter board, for providing said input/output signals;

a custom pin header for communicating input/output signals to and from said second pin grid array socket for providing those signals to and from the printed circuit board on a number of balls less then the entire number of contacts provided by said integrated circuit adapter board for the footprint of said ball grid array (BGA) integrated circuit chip package under test.

5. The adapter of claim 4 wherein said test contacts pins are arranged as a plurality of ribbon cable headers.

6. The adapter of claim 4 wherein said test contact pins are arranged in at least one grid array.

7. The adapter of claim 1 wherein said test contacts are mounted to a separate test header board, and one of a flexible cable and flexible printed circuitry, provides the electrical connection between said interface adapter board and said test header board.

8. The adapter of claim 7 wherein the connections between said input and output signals and said test contacts are programmable such that any one input or output signal can be monitored from any one of said test contacts.

* * * * *